United States Patent [19]

Ikuina et al.

[11] Patent Number: 5,506,058
[45] Date of Patent: Apr. 9, 1996

[54] MUTLILAYER GLASS CERAMIC SUBSTRATE AND METHOD OF FABRICATING THE SAME

[75] Inventors: Kazuhiro Ikuina; Mitsuru Kimura, both of Tokyo, Japan

[73] Assignee: NEC Corporation, Tokyo, Japan

[21] Appl. No.: 224,742

[22] Filed: Apr. 7, 1994

[30] Foreign Application Priority Data

Apr. 22, 1993 [JP] Japan ..................... 5-094718

[51] Int. Cl.⁶ ................................ B32B 17/06
[52] U.S. Cl. ................ 428/426; 428/195; 428/210; 428/545; 428/632
[58] Field of Search .................. 428/545, 195, 428/210, 426, 632; 501/5, 32, 9, 103, 104, 105, 119, 153

[56] References Cited

U.S. PATENT DOCUMENTS

| | | | |
|---|---|---|---|
| 4,490,429 | 12/1984 | Tosaki et al. | 428/195 |
| 5,185,215 | 2/1993 | Adams, Jr. et al. | 428/545 |
| 5,212,121 | 5/1993 | Omata et al. | 501/32 |

FOREIGN PATENT DOCUMENTS

| | | |
|---|---|---|
| 0396155 | 11/1990 | European Pat. Off. |
| 3-060443 | 3/1991 | Japan |
| 4-198039 | 7/1992 | Japan |
| 5-055407 | 3/1993 | Japan |

OTHER PUBLICATIONS

By S. Iwanaga et al., "Glass–ceramic composite substrates", Chemical Abstracts, Jul. 13, 1992, vol. 117, No. 2, p. 339.

By M. Nawa et al., "High–strength glass–ceramics for printed circuit boards", Chemical Abstracts, May 6, 1991, vol. 114, No. 18.

Primary Examiner—Patrick J. Ryan
Assistant Examiner—William A. Krynski
Attorney, Agent, or Firm—Young & Thompson

[57] ABSTRACT

A multilayer glass ceramic substrate includes a glass ceramic layer and a plurality of conductive layers laminated via the glass ceramic layer. The glass ceramic layer is composed of inorganic compound consisting of aluminum oxide, borosilicate glass, anorthite crystal and celsian crystal wherein the aluminum oxide is contained in the range of 12 to 59.6 weight percent, the borosilicate glass is contained in the range of 18 to 69.6 weight percent, the anorthite crystal is contained in the range of 1 to 40 weight percent and the celsian crystal is contained in the range of 1 to 5 weight percent so that the total is 100 weight percent.

8 Claims, 5 Drawing Sheets

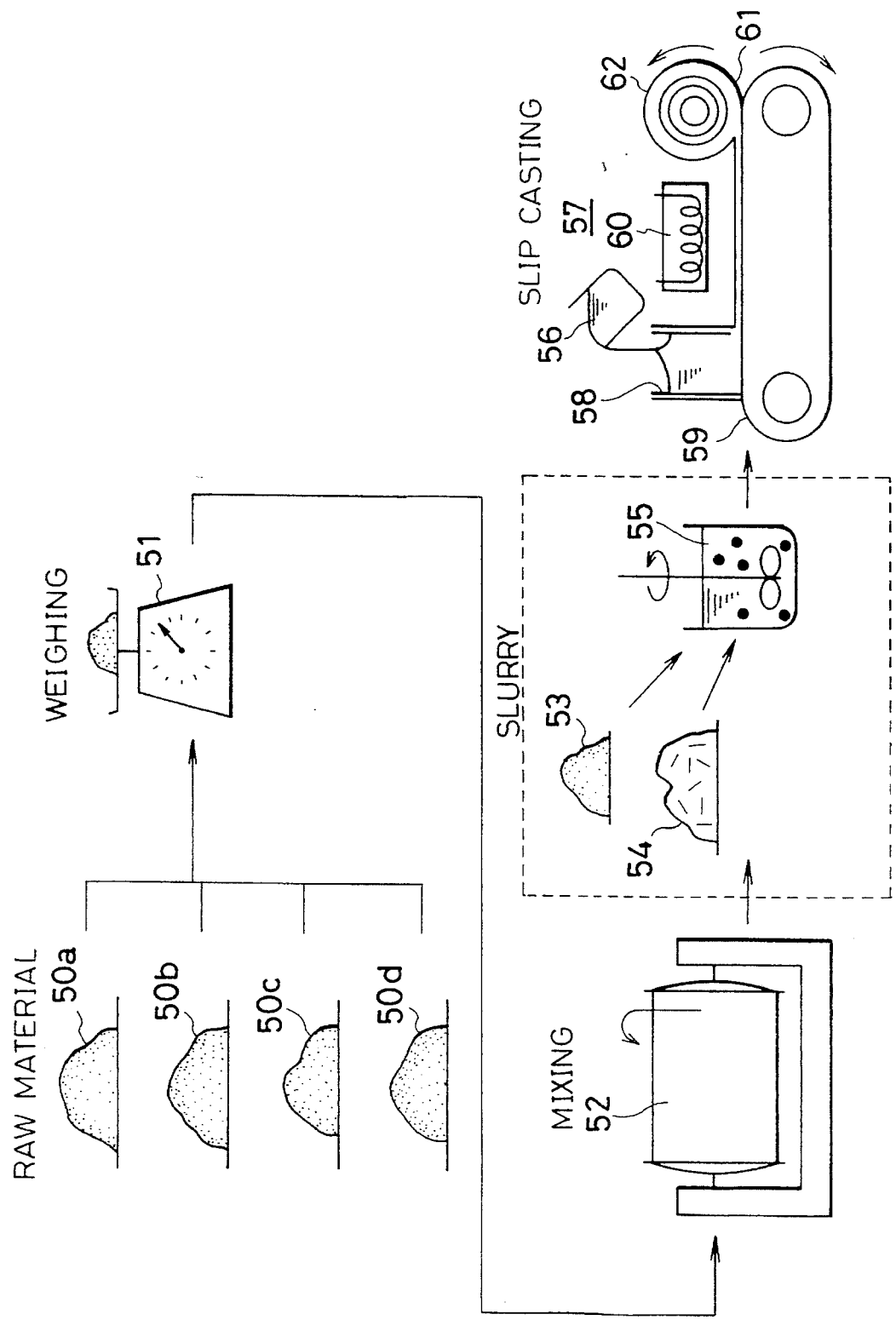

MULTILAYER GLASS CERAMIC SUBSTRATE AND METHOD OF FABRICATING THE SAME

BACKGROUND OF THE INVENTION

1. Field of the Invention

The invention relates to a multilayer glass ceramic substrate suitable for arranging LSI elements in high density, and more particularly to a multilayer glass ceramic substrate which can be fired at relatively low temperature and a method for fabricating the same.

2. Description of the Related Art

With the development of semiconductor technology, an electronic device is more required to be smaller in size and operate at higher speed. In the field of a semiconductor element, since VLSI and ULSI are highly densified and integrated, the technology for assembling these semiconductor elements is required to handle extremely densified and refined components. In particular, a substrate on which semiconductor elements are to be mounted is required to have low dielectric constant and be able to have highly densified leading wire arrangement thereon in response to the requirement of reducing leading wire diameter due to increased density of leading wire arrangement, and also in response to the requirement of reducing resistance of leading wires and the requirement of high operation speed.

An multilayer substrate made of aluminum oxide (aluminum oxide is generally referred to as "alumina") has conventionally been used. This multilayer substrate can be fabricated by thick film printing multilayer process or green sheet lamination process. The green sheet lamination process is detailed, for instance, in U.S. Pat. Nos. 3,423,517 and 3,723,176. The green sheet lamination process is more preferable for accomplishing highly densified arrangement. In the green sheet lamination process, leading wires are printed on each thin ceramic green sheet layer, and then layers are integrally laminated. Accordingly, it is possible to increase a number of layers on which leading wires have been printed, enabling highly densified arrangement of leading wires relative to thick film printing multilayer process. However, since alumina ceramic has the firing temperature above 1500 degrees centigrade, it is necessary for leading wires to use metals having relatively high electrical resistance such as Mo and W. This increases difficulty in reducing diameter of leading wires.

Recently ceramic material which can be fired at relatively low temperature has been developed in order to make it possible to use low-resistive conductors such as Au, Ag-Pd, Ag and Cu. A compound composed of alumina and borosilicate lead glass can be fired at the temperature below 1000 degrees centigrade, and hence a multilayer substrate in which Au, Ag-Pd or Ag is used as leading wires has been developed. Since this compound contains lead, it is impossible to fabricate leading wires of Cu which is a base metal, and in addition thereto, the dielectric constant of the compound can be reduced merely to 7.5 at least.

Another glass ceramic material including borosilicate glass has been developed for the purpose of decreasing dielectric constant and making it possible to fire or bake in reducing atmosphere at the temperature below 1000 degrees centigrade. This material can actually decrease the dielectric constant to about 5.5, and enables multilayering using Cu leading wires by virtue of a process of concurrently firing glass ceramic together with conductors. However, this material has a deficiency that physical strength thereof extremely lowers because of absence of crystallization during being fired.

For instance, Japanese Public Disclosure No. 54-111517 based on U.S. Patent Application No. 875,703 filed on Feb. 6, 1978 in the United States and assigned to International Business Machines Corporation, which was published in Japan on Aug. 31, 1979, discloses non-porous glass ceramic material. This material also has the aforementioned deficiency.

As aforementioned, since conventional alumina multilayer substrate can be fired only at relatively high temperature, high-resistive metals such as Mo and W have to be used as conductors. Accordingly, the resistance of leading wires cannot avoid from increasing, and in addition thereto, it is impossible to reduce the diameter of leading wires. Furthermore, in the conventional substrate, the dielectric constant thereof is relatively high, specifically about 10, and hence it is difficult to transmit signals at high speed.

The aforementioned compound composed of alumina and borosilicate lead glass can be fired at low temperature, and hence low-resistive conductors can be used as leading wires. However, it is quite difficult to fire the compound in reducing atmosphere and use conductive leading wires composed of base metal.

In addition, though the glass ceramic substrate including borosilicate lead glass enables an arrangement of multilayer leading wires made of Cu and decrease of dielectric constant, the physical or mechanical strength of the substrate is enormously lowered. The mechanical strength is quite important characteristic to the substrate. In particular, in a multi-chip substrate on which a lot of semiconductor elements are to be mounted, the substrate has to be enlarged in size and a lot of input and output terminals or pins are connected to each other or another elements. Therefore, there often arise problems of broken substrates and inappropriate connection with metals not only during assembly steps but also after the substrate has been completed.

SUMMARY OF THE INVENTION

It is an object of the present invention to resolve the aforementioned problems involved in the conventional substrate.

More specifically, it is an object of the present invention to provide a multilayer glass ceramic substrate which can be fired or baked not only at the temperature below 1000 degrees centigrade but also in neutral and reducing atmosphere as well as oxidizing atmosphere, and which has low dielectric constant and high mechanical strength.

Another object of the present invention is to provide a substrate in which low resistive metals such as Au, Ag, Cu and Ag-Pd can be used as leading wires, and which enables highly densified arrangement of minute leading wires and high operation speed.

In one aspect, the invention provides a multilayer glass ceramic including a glass ceramic layer, and a plurality of conductive layers laminated via the glass ceramic layer. The glass ceramic layer contains aluminum oxide in the range of 12 to 59.6 weight percent, borosilicate glass in the range of 18 to 69.6 weight percent, anorthite crystal in the range of 1 to 40 weight percent and celsian crystal in the range of 1 to 5 weight percent so that the total is, 100 weight percent.

The substrate may be fabricated of mixed powders including aluminum oxide powder in the range of 30 to 60 weight percent and borosilicate glass powder in the range of 40 to 70 weight percent so that the total is 100 weight percent. The borosilicate glass powder contains calcium oxide in the range of 5 weight percent or more and barium oxide in the range of 0.1 weight percent or more when represented in oxide equivalent indication. The anorthite and celsian crystals are produced during a baking or firing step.

In another aspect, the invention provides a method of fabricating a multilayer glass ceramic substrate including the step of providing mixed powder as raw material. The mixed powder includes aluminum oxide powder in the range of 30 to 60 weight percent and borosilicate glass powder in the range of 40 to 70 weight percent so that the total is 100 weight percent.

In another aspect, the invention provides a method of fabricating a multilayer glass ceramic substrate including the steps of mixing aluminum oxide powder having an average diameter in the range of 0.5 to 3 micrometers, borosilicate glass powder having an average diameter in the range of 1 to 5 micrometers, anorthite powder having an average diameter in the range of 1 to 10 micrometers, and celsian powder having an average diameter in the range of 1 to 10 micrometers, fabricating a green sheet from the mixed powder after the mixed powder is changed into slurry phase, forming a through hole or a so-called via hole with the green sheet, filling spaces in the green sheet and printing a conductive pattern on the green sheet, laminating and adhering the printed sheets to each other, for instance by means of heat and pressure, and firing or baking the laminated and adhered sheets at the temperature below 1000 degrees centigrade.

In a preferred embodiment, the borosilicate glass includes $SiO_2$ in the range of 40 to 75 weight percent, $B_2O_3$ in the range of 5 to 40 weight percent, CaO in the range of 5 to 30 weight percent, BaO in the range of 0.1 to 20 weight percent, $Al_2O_3$ in the range of 0 to 30 weight percent, XO in the range of 0 to 5 weight percent, $Y_2O$ in the range of 0.1 to 5 weight percent, $ZO_2$ in the range of 0.1 to 5 weight percent so that the total is 100 weight percent. The constituent X is selected from the group consisting of Mg and Zn, the constituent Y is selected from the group consisting of Li, Na and K, and the constituent Z is selected from the group consisting of Ti and Zr.

In another aspect, the invention provides a multilayer glass ceramic substrate including a glass ceramic layer, and a plurality of conductive layers laminated via the glass ceramic layer. The glass ceramic layer contains aluminum oxide in the range of 12 to 59.6 weight percent, XX in the range of 10 to 30 weight percent, borosilicate glass in the range of 18 to 69.6 weight percent, anorthite crystal in the range of 1 to 40 weight percent and celsian crystal in the range of 1 to 5 weight percent so that the total is 100 weight percent. The constituent XX is selected one or more from the group consisting of mullite, silica glass, α-silica and cordierite.

The substrate may be fabricated of mixed powders including aluminum oxide powder in the range of 10 to 50 weight percent, XX powder in the range of 10 to 50 weight percent and borosilicate glass powder in the range of 40 to 70 weight percent so that the total is 100 weight percent. The borosilicate glass powder contains calcium oxide in the range of 5 weight percent or more and barium oxide in the range of 0.1 weight percent or more when represented in oxide equivalent indication. The anorthite and celsian crystals are produced during firing step.

The invention also provides a method of fabricating a multilayer glass ceramic substrate, includes the step of providing mixed powder as raw material. The mixed powder includes aluminum oxide powder in the range of 10 to 50 weight percent, XX powder in the range of 10 to 50 weight percent and borosilicate glass powder in the range of 40 to 70 weight percent so that the total is 100 weight percent.

In another aspect, the invention provides a method of fabricating a multilayer glass ceramic substrate includes the steps of mixing aluminum oxide powder having an average diameter in the range of 0.5 to 3 micrometers, XX powder having an average diameter in the range of 0.5 to 10 micrometers, borosilicate glass powder having an average diameter in the range of 1 to 5 micrometers, anorthite powder having an average diameter in the range of 1 to 10 micrometers, and celsian powder having an average diameter in the range of 1 to 10 micrometers, fabricating a green sheet from the mixed powder after the mixed powder is converted into slurry phase, forming a via hole with the green sheet, printing a conductor on said green sheet, filling spaces in the green sheet, depositing and adhering the printed sheets to each other by means of heat and pressure, and firing the deposited and adhered sheets at the temperature below 1000 degrees centigrade. As aforementioned, the constituent XX is selected one or more from the group consisting of mullire, silica glass, α-silica and cordierite.

In a preferred embodiment, the borosilicate glass includes $SiO_2$ in the range of 40 to 75 weight percent, $B_2O_3$ in the range of 5 to 40 weight percent, CaO in the range of 5 to 30 weight percent, BaO in the range of 0.1 to 20 weight percent, $Al_2O_3$ in the range of 0 to 30 weight percent, XO in the range of 0 to 5 weight percent, $Y_2O$ in the range of 0.1 to 5 weight percent, $ZO_2$ in the range of 0.1 to 5 weight percent so that the total is 100 weight percent. The constituent X is selected from the group consisting of Mg and Zn, the constituent Y is selected from the group consisting of Li, Na and K, and the constituent Z is selected from the group consisting of Ti and Zr.

The advantages obtained by the aforementioned present invention will be described hereinbelow.

In accordance with the invention, the substrate can be baked or fired at the temperature below 1000 degrees centigrade. As a result, multilayer structure can be easily formed by means of a green sheet lamination process, and it is possible to advantageously use alloys containing as electrical conductors one or more constituents including base metals to be fired in neutral or reducing atmosphere such as Cu and Ni, as well as Au, Ag, Pd and Pt. Accordingly, it is possible to provide multilayer glass ceramic substrate on which electronic components can be arranged in high density and which is superior in terms of mechanical or physical strength. A substrate is generally required to have bend resistance not less than 2000 kilograms per square centimeter as mechanical strength. The substrate in accordance with the invention has enough strength to meet this requirement.

Explained hereinbelow is the reason why the multilayer glass ceramic substrate in accordance with the invention can be fired or baked at the temperature below 1000 degrees centigrade. When borosilicate glass is being fired, borosilicate glass begins melting at the temperature above about 700 degrees centigrade. Thus melted or liquid-phased glass fills gaps disposed between alumina powders, alumina and anorthite powders, alumina and celsian powders, alumina and silica glass powders, XX and celsian powders, and anorthite and celsian powders, resulting that the substrate is densified. Thus, at the temperature ranging from 800 to 1000 degrees centigrade, the substrate is fired to form a highly densified substrate.

The reason why the compound can be fired in reducing atmosphere is that a specific element is used for suppressing the substrate to be reduced from oxides to metal elements in the aforementioned condition. For instance, if a compound containing lead oxide is to be used for making a glass ceramic, the lead oxide is reduced to metal lead in the reducing atmosphere, resulting that insulation property of the glass ceramic is enormously deteriorated.

Mechanical strength is generally a quite important property for a multilayer glass ceramic substrate. The substrate in accordance with the invention is quite advantageous in this respect. The reason why the substrate in accordance with the invention has strength more than 2000 kilograms per square centimeter is the structure of a glass ceramic after fired. More specifically, alumina and liquid-phased glass are in chemical reaction during being fired, thereby to produce anorthite and celsian crystals. Thus, in a fired glass ceramic, alumina particles, vitreous parts and anorthite and celsian crystals form a highly densified three dimensional structure, or alumina particles, XX particles, vitreous parts and anorthite and celsian crystals form a high densified three dimensional structure. As a result, ceramic is strongly combined with glass to thereby provide the substrate with sufficiently high resistance against bend.

The above and other objects and advantageous features of the present invention will be made apparent from the following description.

BRIEF DESCRIPTION OF THE DRAWINGS

FIG. 5 illustrates steps of forming another green sheet from which a multilayer glass ceramic substrate in accordance with the invention is fabricated.

DESCRIPTION OF THE PREFERRED EMBODIMENTS

A preferred embodiment in accordance with the invention will be explained hereinbelow.

EXAMPLE 1

In Table 1 is shown constituents of compounds of which a glass ceramic layer is constituted.

TABLE 1

| Sample No. | Constituent (weight %) | | | |
|---|---|---|---|---|
| | Alumina | Borosilicate Glass | Anorthite Crystal | Celsian Crystal |
| 1 | 12.0 | 47.0 | 40.0 | 1.0 |
| 2 | 12.0 | 53.0 | 34.0 | 1.0 |
| 3 | 12.4 | 69.6 | 13.0 | 5.0 |

TABLE 1-continued

| Sample No. | Constituent (weight %) | | | |
|---|---|---|---|---|
| | Alumina | Borosilicate Glass | Anorthite Crystal | Celsian Crystal |
| 4 | 17.0 | 42.0 | 40.0 | 1.0 |
| 5 | 17.0 | 43.0 | 38.5 | 1.5 |
| 6 | 18.0 | 40.0 | 39.0 | 3.0 |
| 7 | 22.0 | 45.0 | 31.5 | 1.5 |
| 8 | 23.0 | 47.0 | 28.5 | 1.5 |
| 9 | 23.0 | 38.0 | 38.0 | 1.0 |
| 10 | 23.0 | 40.0 | 35.5 | 1.5 |
| 11 | 28.0 | 39.0 | 31.5 | 1.5 |
| 12 | 28.0 | 51.0 | 17.0 | 4.0 |
| 13 | 28.0 | 40.0 | 29.0 | 3.0 |
| 14 | 28.0 | 35.0 | 35.0 | 2.0 |
| 15 | 33.0 | 36.0 | 28.0 | 3.0 |
| 16 | 33.0 | 25.0 | 40.0 | 2.0 |
| 17 | 33.0 | 30.0 | 35.0 | 2.0 |
| 18 | 34.0 | 45.0 | 17.0 | 4.0 |
| 19 | 38.0 | 38.0 | 22.5 | 1.5 |
| 20 | 38.0 | 34.0 | 26.5 | 1.5 |
| 21 | 39.0 | 28.0 | 31.0 | 2.0 |
| 22 | 39.0 | 40.0 | 18.0 | 3.0 |
| 23 | 42.0 | 38.0 | 18.5 | 1.5 |
| 24 | 42.0 | 28.0 | 29.0 | 1.0 |
| 25 | 42.0 | 30.0 | 26.0 | 2.0 |
| 26 | 42.5 | 34.5 | 21.0 | 2.0 |
| 27 | 46.0 | 31.0 | 21.0 | 2.0 |
| 28 | 46.0 | 33.0 | 19.0 | 2.0 |
| 29 | 48.0 | 18.0 | 32.5 | 1.5 |
| 30 | 48.0 | 21.0 | 30.0 | 1.0 |
| 31 | 49.0 | 21.0 | 29.0 | 1.0 |
| 32 | 49.0 | 26.0 | 24.0 | 1.0 |
| 33 | 52.0 | 28.0 | 18.5 | 1.5 |
| 34 | 52.0 | 30.0 | 17.0 | 1.0 |
| 35 | 53.0 | 22.0 | 24.0 | 1.0 |
| 36 | 53.0 | 24.0 | 22.0 | 1.0 |
| 37 | 56.0 | 25.0 | 18.0 | 1.0 |
| 38 | 56.0 | 21.0 | 12.0 | 1.0 |
| 39 | 57.0 | 24.0 | 18.0 | 1.0 |
| 40 | 59.6 | 19.4 | 19.5 | 1.5 |

Hereinbelow is explained a method for fabricating the compounds shown in Table 1.

Figure 1:
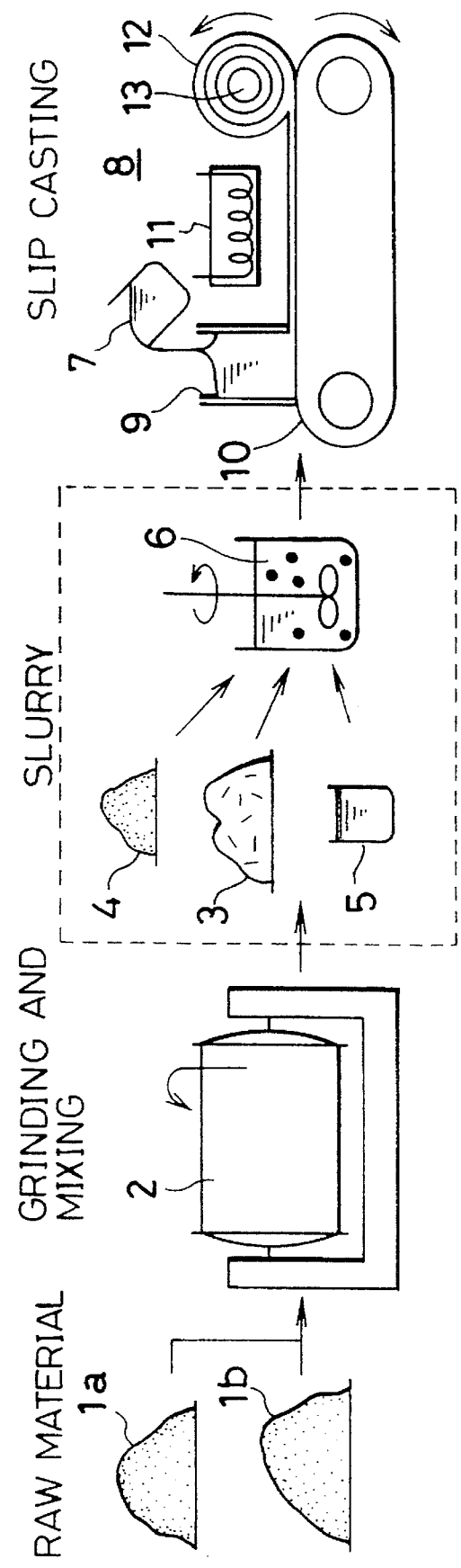
FIG. 1 illustrates steps of forming a green sheet from which a multilayer glass ceramic substrate in accordance with the invention is fabricated.

FIG. 1 illustrates steps of forming a green sheet from which a multilayer glass ceramic substrate in accordance with the invention is fabricated. First, alumina or aluminum oxide powder 1a and borosilicate glass powder 1b are ground in a grinder 2 and concurrently mixed with each other so that the ratio of the former to the latter is in the range of 30:70 to 60:40 weight percent. It should be noted that the aforementioned borosilicate glass powder 1b contains calcium oxide by 10 weight percent and barium oxide by 5 weight percent when represented with oxide equivalent score. Then, the mixed powder 3 together with organic binder 4 such as polyvinyl butyral, polyvinyl alcohol and polyacrylic resin are dispersed in solvent 6. The solvent including the mixed powder 3 and the binder 4 is stirred up for a sufficient period of time, thereby the mixture becomes slurry 7. Then, the slurry 7 is introduced into a green sheet forming apparatus 8 through an inlet 9 thereof. The apparatus 8 forms a green sheet by means of slip casting process. The slurry 7 of the mixture is deposited on an endless forming belt 10 and then transported as the forming belt 10 runs. Above the forming belt 10 is disposed a heater 11 for applying heat to the slurry 7 being fed on the forming belt 10. The slurry 7 is thermally cured by heat applied from the heater 11 to thereby continuously form a green sheet 12. Thus fabricated green sheet 12 is wound up around a roller 13 disposed above an end of the forming belt 10. Thus produced green sheet 12 has a uniform thickness in the range of 10 to 400 micrometers. It is possible to vary-the thickness of the green sheet so that the green sheet has a desired thickness.

Figure 2:
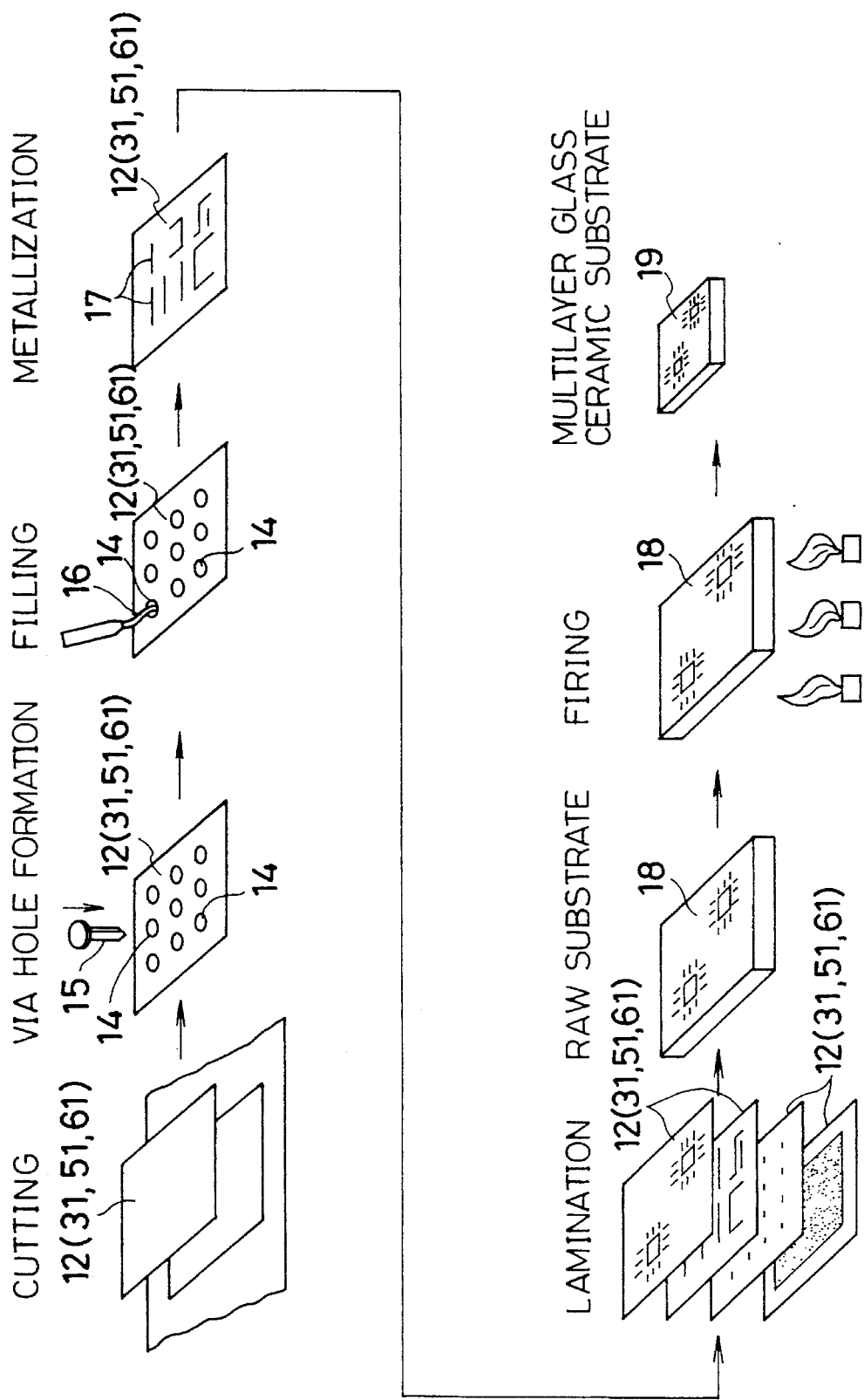
FIG. 2 illustrates steps for fabricating a multilayer glass ceramic substrate in accordance with the invention from a green sheet fabricated according to the steps illustrated in FIG. 1.

FIG. 2 illustrates steps for fabricating a multilayer glass ceramic substrate in accordance with the invention from the green sheet 12 formed as aforementioned. First, the green sheet 12 is cut off to separate sheets having a desired length. Then, a plurality of through holes or so-called via holes 14 for connecting upper and lower conductors with each other are formed in the green sheet 12 by means of a punching machine such as a punch and die 15. The via holes 14 are then filled With conductive paste 16, and subsequently leading wire pattern 17 is printed on the green sheet 12 with the conductive paste 16. The conductive paste 16 used herein includes conductors such as Au, Ag, Ag-Pd, Cu, Ni and Ag-Pt, and is printed at a predetermined pattern 17 by a screen printing process. Then, a predetermined number of the green sheets 12 the via holes 14 of which were filled with the conductive paste 16 and on which the conductive patterns 17 were printed are laminated one on another, and are secured to each other by applying heat and pressure. Thus, a raw substrate 18 comprising laminated green sheets is obtained. Then, the organic binder 4 and solvent 6 which were added at the formation of the green sheet 12 are removed at the temperature in the range of 400 to 700 degrees centigrade. Next, the raw substrate 18 is fired at the temperature in the range of 800 to 1000 degrees centigrade to thereby form a multilayer glass ceramic substrate 19. During the firing, glass is softened to thereby occupy spaces disposed among alumina particles, resulting that the resultant substrate 19 is highly densified. In addition, the reaction of the glass with the alumina particles produces anorthite and celsian crystals.

Figure 3:
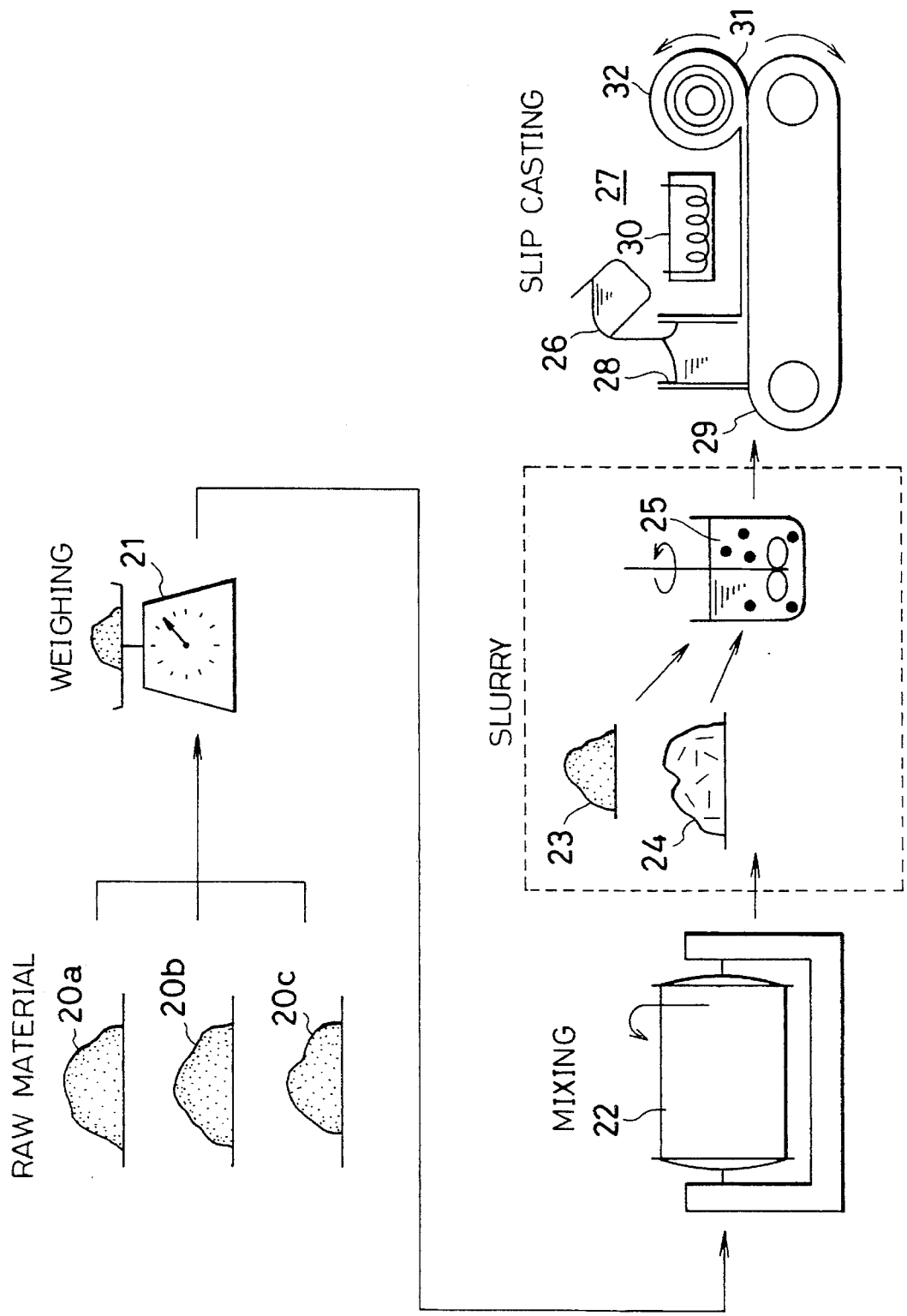
FIG. 3 illustrates steps of forming another green sheet from which a multilayer glass ceramic substrate in accordance with the invention is fabricated.

Explained hereinbelow is another method for fabricating a green sheet with reference to FIG. 3. The alumina particles 20a are ground into powders so that the powders have the average diameter ranging from 0.5 to 3 micrometers. Furthermore, borosilicate glass 20b is ground into powders, for instance, by an alumina ball mill so that the powders have the average diameter ranging from 1 to 5 micrometers. Similarly, anorthite and celsian 20c are ground into powders so that the powders have the average diameter ranging from 1 to 10 micrometers. These powders are weighed with a weighing device 21 so that they constitute a target composition rate, and then uniformly mixed with an alumina ball mill 22. Then, the mixed powder 23 including the powders 20a, 20b and 20c together with organic binder 24 such as polyvinyl butyral, polyvinyl alcohol and polyacrylic resin are dispersed in solvent 25. The solvent 25 including the mixed powder 23 and the binder 24 is stirred up for a sufficient period of time, thereby the mixture becomes slurry 26. Then, the slurry 26 is introduced into a green sheet forming apparatus 27 through an inlet 28 thereof. The apparatus 27 forms a green sheet by means of slip casting process such as doctor blade process and roll process. The slurry 26 of the mixture is deposited on an endless forming belt 29 and then transported as the forming belt 29 runs. Above the forming belt 29 is disposed a heater 30 for applying heat to the slurry 26 being fed on the forming belt 29. The slurry 26 is thermally cured by heat applied from the heater 30 to thereby continuously form a green sheet 31. Thus fabricated green sheet 31 is wound up around a roller 32 disposed above an end of the forming belt 29. The green sheet 31 is formed to have a thickness suitable for forming an insulation layer. For instance, the green sheet 31 has a thickness in the range of 10 to 40 micrometers.

Thus fabricated green sheet 31 is subject to the steps as illustrated in FIG. 2, thereby to obtain a multilayer glass ceramic substrate.

First, the green sheet 31 is cut off to separate sheets having a desired length. Then, a plurality of through holes or so-called via holes 14 for connecting upper and lower conductors with each other are formed in the green sheet 31 by means of a punching machine such as a punch and die 15. The via holes 14 are then filled with conductive paste 16, and subsequently leading wire pattern 17 is printed on the green sheet 31 with the conductive paste 16. The conductive paste 16 used herein includes conductors such as Au, Ag, Ag-Pd and Cu, and is printed at a predetermined pattern 17 by screen printing process. Then, a predetermined number of the green sheets 31 the via holes 14 of which were filled with the conductive paste 16 and on which the conductive patterns 17 were printed are laminated one on another, and are secured to each other by applying heat at the temperature in the range of 100 to 120 degrees centigrade and pressure in the range of 100 to 300 kilograms per square centimeter. Thus, a raw substrate 18 made of laminated green sheets is obtained. Then, the organic binder 4 and solvent 6 which were added at the formation of the green sheet 31 are removed at the temperature in the range of 400 to 600 degrees centigrade. Next, the raw substrate 18 is fired at the temperature in the range of 800 to 1000 degrees centigrade to thereby form a multilayer glass ceramic substrate 19.

Tables 2 and 3 show the firing condition under which the multilayer glass ceramic substrate was fabricated, and the specification and characteristics of leading wires. As aforementioned, the sample numbers in Table 1 show the constituent of the glass ceramic layers in the fired substrate, and correspond to the sample numbers shown in Tables 2 and 3.

TABLE 2

| Sample No. | Firing Temp. [°C.] | Conductor | Atmosphere | Number of layers | Width [μm] | Pitch [μm] | Diameter [μm] | Dielectric Constant | Thermal Expansion Coefficient [×10$^{-7}$/deg] | Anti-Bend Strength [Kg/cm$^2$] | Insulation Resistance [Ω-cm] |
|---|---|---|---|---|---|---|---|---|---|---|---|
| 1 | 900 | Ag | Air | 30 | 120 | 300 | 150 | 5.0 | 40 | 2200 | >10$^{13}$ |
| 2 | 900 | Ag | Air | 30 | 120 | 300 | 150 | 4.9 | 41 | 2300 | >10$^{13}$ |
| 3 | 910 | Ag-Pd | Air | 30 | 120 | 300 | 150 | 4.8 | 43 | 2300 | >10$^{13}$ |
| 4 | 880 | Cu | N$_2$ | 30 | 120 | 250 | 120 | 5.1 | 40 | 2200 | >10$^{13}$ |
| 5 | 850 | Cu | N$_2$ | 30 | 120 | 250 | 120 | 5.5 | 43 | 2300 | >10$^{13}$ |
| 6 | 850 | Cu | N$_2$ | 30 | 120 | 250 | 120 | 4.7 | 46 | 2600 | >10$^{13}$ |
| 7 | 900 | Cu | N$_2$ + H$_2$ | 40 | 150 | 300 | 150 | 5.4 | 40 | 2300 | >10$^{13}$ |
| 8 | 910 | Cu | N$_2$ + H$_2$ | 40 | 150 | 300 | 150 | 5.2 | 44 | 2300 | >10$^{13}$ |
| 9 | 900 | Ag | Air | 40 | 150 | 300 | 150 | 4.9 | 48 | 2400 | >10$^{13}$ |
| 10 | 900 | Ag | Air | 40 | 150 | 300 | 150 | 4.6 | 49 | 2600 | >10$^{13}$ |
| 11 | 890 | Ag | Air | 40 | 150 | 300 | 200 | 5.4 | 43 | 2700 | >10$^{13}$ |
| 12 | 880 | Ag | Air | 40 | 150 | 300 | 200 | 5.2 | 47 | 2500 | >10$^{13}$ |

TABLE 2-continued

| Sample No. | Firing Temp. [°C.] | Conductor | Atmosphere | Number of layers | Dimension of Leading Wire Width [μm] | Dimension of Leading Wire Pitch [μm] | Dimension of Leading Wire Diameter [μm] | Dielectric Constant | Thermal Expansion Coefficient [×10⁻⁷/deg] | Anti-Bend Strength [Kg/cm²] | Insulation Resistance [Ω-cm] |
|---|---|---|---|---|---|---|---|---|---|---|---|
| 13 | 900 | Ag-Pd | Air | 40 | 150 | 300 | 200 | 5.1 | 49 | 2400 | >10¹³ |
| 14 | 880 | Ag-Pd | Air | 30 | 150 | 300 | 200 | 4.8 | 52 | 2600 | >10¹³ |
| 15 | 880 | Ag-Pd | Air | 30 | 100 | 200 | 100 | 6.1 | 41 | 2600 | >10¹³ |
| 16 | 900 | Ag-Pd | Air | 30 | 100 | 200 | 100 | 5.8 | 45 | 2400 | >10¹³ |
| 17 | 870 | Ag | Air | 30 | 100 | 250 | 120 | 5.8 | 46 | 2500 | >10¹³ |
| 18 | 850 | Ag | Air | 30 | 100 | 250 | 120 | 5.6 | 49 | 2500 | >10¹³ |
| 19 | 890 | Ag | Air | 30 | 100 | 250 | 120 | 5.8 | 47 | 2700 | >10¹³ |
| 20 | 900 | Ag | Air | 35 | 100 | 300 | 150 | 5.7 | 47 | 2500 | >10¹³ |

TABLE 3

| Sample No. | Firing Temp. [°C.] | Conductor | Atmosphere | Number of layers | Dimension of Leading Wire Width [μm] | Dimension of Leading Wire Pitch [μm] | Dimension of Leading Wire Diameter [μm] | Dielectric Constant | Thermal Expansion Coefficient [×10⁻⁷/deg] | Anti-Bend Strength [Kg/cm²] | Insulation Resistance [Ω-cm] |
|---|---|---|---|---|---|---|---|---|---|---|---|
| 21 | 900 | Cu | $N_2$ | 35 | 100 | 300 | 150 | 5.7 | 43 | 2500 | >10¹³ |
| 22 | 850 | Cu | $N_2$ | 35 | 100 | 300 | 150 | 5.4 | 48 | 2800 | >10¹³ |
| 23 | 930 | Cu | $N_2$ | 35 | 100 | 300 | 150 | 6.4 | 39 | 2400 | >10¹³ |
| 24 | 900 | Cu | $N_2$ | 40 | 150 | 300 | 150 | 5.7 | 45 | 2500 | >10¹³ |
| 25 | 910 | Cu | $N_2 + H_2$ | 40 | 150 | 350 | 150 | 5.5 | 48 | 2500 | >10¹³ |
| 26 | 900 | Au | Air | 40 | 150 | 350 | 150 | 5.4 | 50 | 2600 | >10¹³ |
| 27 | 900 | Ag | Air | 40 | 150 | 250 | 150 | 5.4 | 51 | 2700 | >10¹³ |
| 28 | 880 | Cu | $N_2$ | 40 | 150 | 250 | 150 | 5.8 | 53 | 2800 | >10¹³ |
| 29 | 950 | Cu | $N_2$ | 40 | 120 | 300 | 120 | 6.3 | 45 | 2500 | >10¹³ |
| 30 | 930 | Ag-Pd | Air | 30 | 120 | 300 | 120 | 6.2 | 47 | 2500 | >10¹³ |
| 31 | 900 | Ag-Pd | Air | 30 | 120 | 300 | 120 | 6.0 | 49 | 2400 | >10¹³ |
| 32 | 900 | Au | Air | 30 | 120 | 300 | 120 | 5.8 | 51 | 2300 | >10¹³ |
| 33 | 930 | Cu | $N_2$ | 30 | 120 | 250 | 100 | 6.3 | 48 | 2400 | >10¹³ |
| 34 | 910 | Cu | $N_2$ | 30 | 120 | 250 | 100 | 6.1 | 50 | 2400 | >10¹³ |
| 35 | 950 | Ag-Pd | Air | 30 | 120 | 250 | 100 | 6.0 | 51 | 2300 | >10¹³ |
| 36 | 950 | Ag-Pd | Air | 30 | 100 | 200 | 80 | 6.0 | 51 | 2300 | >10¹³ |
| 37 | 930 | Ag-Pd | Air | 40 | 100 | 250 | 120 | 6.3 | 50 | 2400 | >10¹³ |
| 38 | 960 | Ag-Pd | Air | 40 | 100 | 250 | 120 | 6.1 | 52 | 2300 | >10¹³ |
| 39 | 900 | Ag | Air | 40 | 100 | 250 | 120 | 6.0 | 54 | 2200 | >10¹³ |
| 40 | 900 | Cu | $N_2$ | 40 | 80 | 200 | 80 | 6.1 | 55 | 2100 | >10¹³ |

As is clearly understood from Tables 2 and 3, the compounds in accordance with the aforementioned embodiment can provide a multilayer glass ceramic substrate on which highly densified and fine leading wires can be arranged and which is superior in many characteristics and has mechanical strength necessary for practical use.

Following points were clarified by the embodiment.

1. If the content of alumina is under 12 weight percent, the resistance against bend of the substrate is below 2000 kilograms per square centimeter. This is not sufficient strength for a substrate. If the content of alumina is above 59.6 weight percent, the substrate cannot be sufficiently fired at the temperature below 1000 degrees centigrade, resulting that the insulation resistance is decreased and the resistance against bend is below 2000 kilograms per square centimeter. In addition, since the dielectric constant of the substrate exceeds 7, high speed operation is difficult to achieve and accordingly it is difficult to obtain a multilayer glass ceramic substrate suitable for practical use.

2. If the content of borosilicate glass is under 18 weight percent, it is not possible to obtain glass phase for sufficiently filling gaps disposed among alumina particles with the result that the strength and the reliability of the substrate is decreased. If the content of borosilicate glass is above 69.6 weight percent, the inherent strength of glass is predominant, resulting that the anti-bend strength is decreased below 2000 kilograms per square centimeter.

3. If the content of the anorthite and celsian crystals is below 1 weight percent, the substrate cannot have the strength against bend above 2000 kilograms per square centimeter for lack of assist of the anorthite and celsian crystals to the anti-bend strength. If the content of the anorthite and celsian crystals is over 50 weight percent, the flexibility of the multilayer glass ceramic substrate becomes uniform with result that the reliability is reduced.

4. If the content of alumina powder used as raw material is below 30 weight percent, the alumina powder is reacted with glass in low level, so that the crystals of the anorthite and celsian is insufficiently produced during the firing step, or the crystals of the anorthite and celsian is produced with lack of uniformity, both resulting that the anti-bend resistance of the substrate is below 2000 kilograms per square centimeter.. If the content of alumina powder is above 60 weight percent, the substrate cannot be sufficiently fired at the temperature below 1000 degrees centigrade, resulting that the insulation resistance is decreased and the resistance against bend is also decreased. In addition, the dielectric constant of the substrate exceeds 7.

5. If the content of borosilicate glass powder used as raw material is below 40 weight percent, the alumina powder is reacted with the glass powder in lower level, so that the growth of the crystals of the anorthite and celsian is prevented to a large extend and accordingly the crystals grow unhomogeneously. This causes lower strength of the substrate. If the content of borosilicate glass powder is above 70 weight percent, the glass are more softened during the firing step. This causes the fired substrate to have dimensional instability, and hence it is not possible to obtain a substrate suitable for practical use.

6. If borosilicate glass used as raw material contains calcium in the form of calcium oxide below 5 weight percent when represented with oxide equivalent representation, the crystals of anorthite is scarcely produced. If the content of barium oxide is below 0.1 weight percent in a similar representation, the crystals of celsian is scarcely produced.

7. If the diameter of alumina powder used as raw material is below 0.5 micrometers or above 3 micrometers, the diameter of borosilicate glass powder is below 1 micrometer or above 5 micrometers, and the diameter of anorthite and celsian powders is below 1 micrometer or 10 micrometers, the mixture cannot be well fired, and hence the characteristics reliability of a multilayer glass ceramic substrate is enormously deteriorated. Thus, a multilayer glass ceramic substrate suitable for practical use cannot be obtained.

EXAMPLE 2

Tables 4 and 5 show compounds for constituting a glass ceramic layer.

TABLE 4

| Sample No. | Constituent (weight %) | | | | | | | |
|---|---|---|---|---|---|---|---|---|
| | Alumina | Mullite | Silica Glass | α-Silica | Cordierite | Borosilicate Glass | Anorthite Crystal | Celsian Crystal |
| 1 | 12.0 | 10.0 | 10.0 | 1.0 | 0 | 36.0 | 30.0 | 1.0 |
| 2 | 12.0 | 6.0 | 5.0 | 0 | 10.0 | 36.0 | 30.0 | 1.0 |
| 3 | 12.0 | 0 | 0 | 11.0 | 10.0 | 36.0 | 30.0 | 1.0 |
| 4 | 12.0 | 0 | 10.0 | 0 | 11.0 | 36.0 | 30.0 | 1.0 |
| 5 | 12.0 | 30.0 | 0 | 0 | 0 | 32.0 | 25.0 | 1.0 |
| 6 | 12.0 | 14.0 | 0 | 16.0 | 0 | 32.0 | 25.0 | 1.0 |
| 7 | 12.0 | 0 | 30.0 | 0 | 0 | 32.0 | 25.0 | 1.0 |
| 8 | 12.0 | 0 | 0 | 30.0 | 0 | 32.0 | 25.0 | 1.0 |
| 9 | 12.0 | 0 | 0 | 0 | 30.0 | 32.0 | 25.0 | 1.0 |
| 10 | 12.4 | 10.0 | 0 | 1.0 | 0 | 69.6 | 18.0 | 2.0 |
| 11 | 17.0 | 10.0 | 0 | 15.0 | 0 | 32.0 | 25.0 | 1.0 |
| 12 | 17.0 | 15.0 | 0 | 0 | 10.0 | 32.0 | 25.0 | 1.0 |
| 13 | 17.0 | 10.0 | 0 | 0 | 0 | 28.0 | 40.0 | 5.0 |
| 14 | 17.0 | 0 | 10.0 | 0 | 0 | 28.0 | 40.0 | 5.0 |
| 15 | 17.0 | 0 | 0 | 10.0 | 0 | 28.0 | 40.0 | 5.0 |
| 16 | 17.0 | 0 | 0 | 0 | 10.0 | 28.0 | 40.0 | 5.0 |
| 17 | 18.0 | 1.0 | 0 | 0 | 0 | 40.0 | 20.0 | 1.0 |
| 18 | 22.0 | 0 | 10.0 | 8.0 | 0 | 25.0 | 32.0 | 3.0 |
| 19 | 23.0 | 5.0 | 5.0 | 0 | 5.0 | 27.0 | 32.0 | 3.0 |
| 20 | 23.0 | 0 | 0 | 9.0 | 10.0 | 37.0 | 20.0 | 1.0 |
| 21 | 23.0 | 14.0 | 0 | 10.0 | 0 | 20.0 | 31.0 | 2.0 |
| 22 | 28.0 | 10.0 | 0 | 5.0 | 5.0 | 19.0 | 31.0 | 2.0 |
| 23 | 28.0 | 0 | 5.0 | 0 | 5.0 | 51.0 | 10.0 | 1.0 |
| 24 | 28.0 | 0 | 0 | 5.0 | 12.0 | 39.0 | 15.0 | 1.0 |
| 25 | 28.0 | 11.0 | 6.0 | 0 | 0 | 33.0 | 20.0 | 2.0 |
| 26 | 33.0 | 7.0 | 3.0 | 0 | 7.0 | 35.0 | 14.0 | 1.0 |
| 27 | 33.0 | 3.0 | 3.0 | 3.0 | 3.0 | 25.0 | 28.0 | 2.0 |
| 28 | 33.0 | 0 | 6.0 | 6.0 | 6.0 | 20.0 | 28.0 | 1.0 |
| 29 | 34.0 | 1.0 | 3.0 | 3.0 | 3.0 | 45.0 | 10.0 | 1.0 |
| 30 | 38.0 | 7.0 | 6.0 | 6.0 | 0 | 18.0 | 23.0 | 2.0 |

TABLE 5

| Sample No. | Constituent (weight %) | | | | | | | |
|---|---|---|---|---|---|---|---|---|
| | Alumina | Mullite | Silica Glass | α-Silica | Cordierite | Borosilicate Glass | Anorthite Crystal | Celsian Crystal |
| 31 | 38.0 | 6.0 | 6.0 | 6.0 | 6.0 | 24.0 | 13.0 | 1.0 |
| 32 | 39.0 | 3.0 | 3.0 | 3.0 | 6.0 | 28.0 | 17.0 | 1.0 |
| 33 | 39.0 | 0 | 0 | 4.0 | 7.0 | 39.0 | 10.0 | 1.0 |
| 34 | 42.0 | 0 | 3.0 | 0 | 8.0 | 18.0 | 27.0 | 2.0 |
| 35 | 42.0 | 10.0 | 0 | 0 | 2.0 | 28.0 | 17.0 | 1.0 |
| 36 | 42.0 | 0 | 2.0 | 0 | 8.0 | 29.0 | 18.0 | 1.0 |
| 37 | 42.5 | 4.0 | 3.0 | 3.0 | 3.0 | 33.5 | 10.0 | 1.0 |
| 38 | 46.0 | 2.0 | 0 | 0 | 8.0 | 31.0 | 21.0 | 2.0 |
| 39 | 46.0 | 1.0 | 1.0 | 1.0 | 8.0 | 32.0 | 10.0 | 1.0 |
| 40 | 48.0 | 1.0 | 2.0 | 3.0 | 5.0 | 18.0 | 21.0 | 2.0 |
| 41 | 48.0 | 0 | 4.0 | 8.0 | 0 | 21.0 | 18.0 | 1.0 |

TABLE 5-continued

| Sample No. | Constituent (weight %) | | | | | | | |
|---|---|---|---|---|---|---|---|---|
| | Alumina | Mullite | Silica Glass | α-Silica | Cordierite | Borosilicate Glass | Anorthite Crystal | Celsian Crystal |
| 42 | 49.0 | 0 | 7.0 | 3.0 | 0 | 21.0 | 19.0 | 1.0 |
| 43 | 49.0 | 2.0 | 3.0 | 4.0 | 6.0 | 25.0 | 10.0 | 1.0 |
| 44 | 52.0 | 2.0 | 0 | 5.0 | 5.0 | 18.0 | 17.0 | 1.0 |
| 45 | 52.0 | 0 | 2.0 | 5.0 | 5.0 | 19.0 | 16.0 | 1.0 |
| 46 | 53.0 | 1.0 | 5.0 | 0 | 5.0 | 22.0 | 13.0 | 1.0 |
| 47 | 56.0 | 10.0 | 0 | 0 | 0 | 24.0 | 9.0 | 1.0 |
| 48 | 56.0 | 5.0 | 0 | 0 | 5.0 | 21.0 | 11.0 | 2.0 |
| 49 | 57.0 | 0 | 0 | 10.0 | 0 | 24.0 | 7.0 | 2.0 |
| 50 | 59.6 | 0 | 2.0 | 0 | 8.0 | 19.4 | 8.0 | 3.0 |

Hereinbelow is explained a method for fabricating the compounds shown in Tables 4 and 5.

Figure 4:
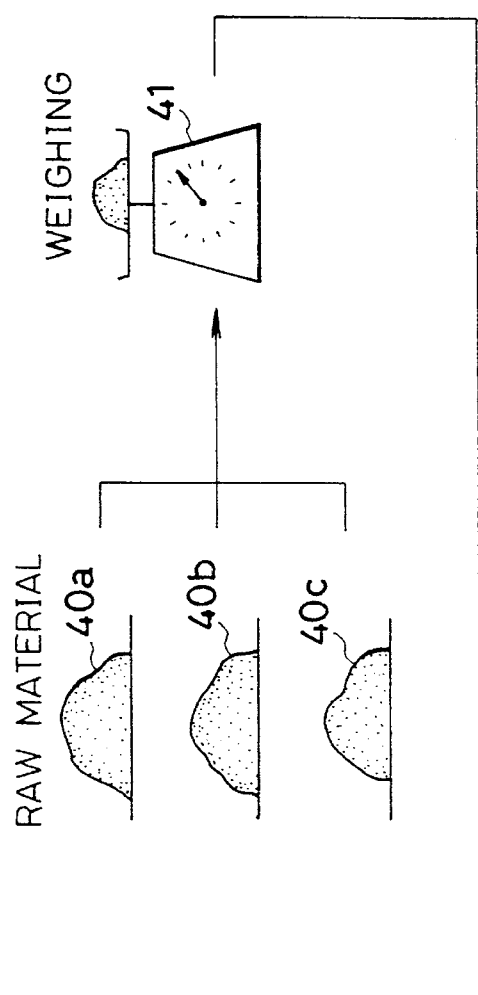
FIG. 4 illustrates steps of forming another green sheet from which a multilayer glass ceramic substrate in accordance with the invention is fabricated.
Figure 4:
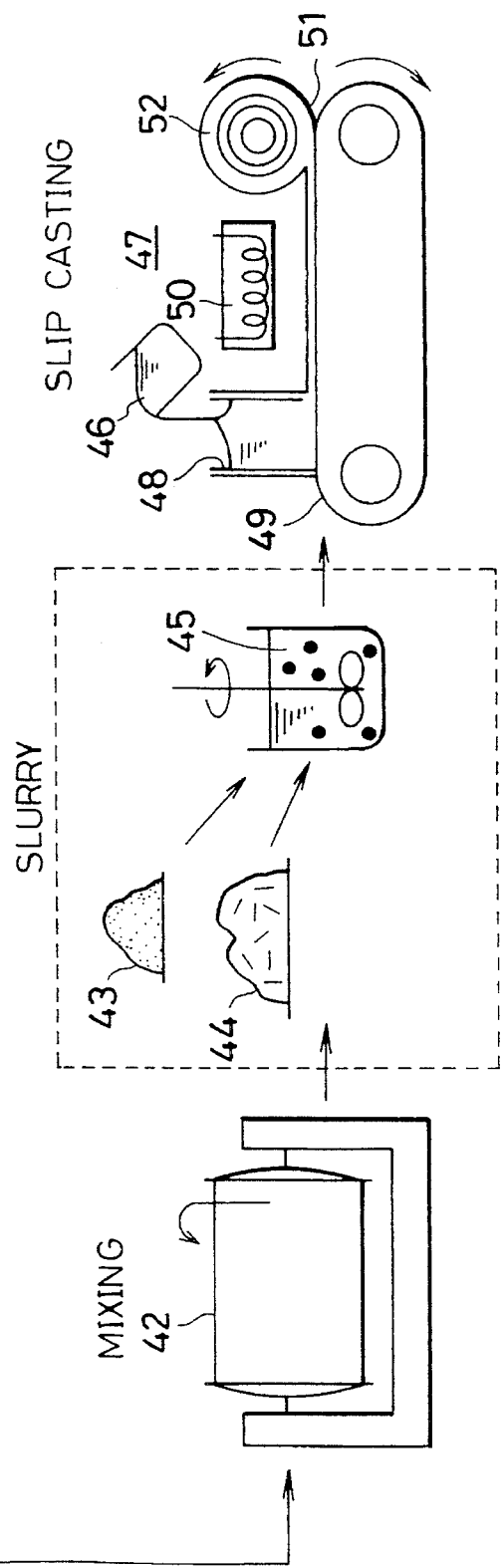

FIG. 4 illustrates steps of forming a green sheet from which a multilayer glass ceramic substrate in accordance with the invention is fabricated.

First, aluminum oxide powder 40a and XX powder 40b are weighed with a weighing device 41 and mixed in a mixer 42 with weighed borosilicate glass powder 40c so that the ratio of the former two powders 40a, 40b to the latter 40c is in the range of 30:70 to 60:40 weight percent. It should be noted that the alumina powder 40a is contained in a resultant green sheet by at least 10 weight percent and that the borosilicate glass powder 40c contains calcium oxide by 10 weight percent and barium oxide by 5 weight percent when represented with oxide equivalent score. The mixed powder 43 including the powders 40a, 40b and 40c together with organic binder 44 such as polyvinyl butyral, polyvinyl alcohol and polyacrylic resin are dispersed in solvent 45. The solvent 45 including the mixed powder 43 and the binder 44 is stirred up for a sufficient period of time, thereby the mixture becomes slurry 46. Then, the slurry 46 is introduced into a green sheet forming apparatus 47 through an inlet 48 thereof. The apparatus 47 forms a green sheet by means of slip casting process such as doctor blade process and roll process. The slurry 46 of the mixture is deposited on an endless forming belt 49 and then transported as the forming belt 49 runs. Above the forming belt 49 is disposed a heater 50 for applying heat to the slurry 46 being fed on the forming belt 49. The slurry 46 is thermally cured by heat applied from the heater 50 to thereby continuously form a green sheet 51. Thus fabricated green sheet 51 is wound up around a roller 52 disposed above an end of the forming belt 49. Thus produced green sheet 51 has a uniform thickness in the range of 10 to 400 micrometers. It is possible to vary the thickness of the green sheet to a desired thickness.

Thus fabricated green sheet 51 is subject to the steps as illustrated in FIG. 2, thereby to obtain a multilayer glass ceramic substrate.

First, the green sheet 51 is cut off to separate sheets having a desired length. Then, a plurality of through holes or so-called via holes 14 for connecting upper and lower conductors with each other are formed in the green sheet 31 by means of a punching machine such as a punch and die 15. The via holes 14 are then filled with conductive paste 16, and subsequently leading wire pattern 17 is printed on the green sheet 51 with the conductive paste 16. The conductive paste 16 used herein includes conductors such as Au, Ag, Ag-Pd and Cu, and is printed at a predetermined pattern 17 by screen printing process. Then, a predetermined number of the green sheets 51 the via holes 14 of which were filled with the conductive paste 16 and on which the conductive patterns 17 were printed are laminated one on another, and are secured to each other by applying heat and pressure. Thus, a raw substrate 18 made of laminated green sheets is obtained. Then, the organic binder 4 and solvent 6 which were added at the formation of the green sheet 51 are removed at the temperature in the range of 400 to 700 degrees centigrade. Next, the raw substrate 18 is fired at the temperature in the range of 800 to 1000 degrees centigrade to thereby form a multilayer glass ceramic substrate 19. During the firing, glass is softened to thereby occupy spaces disposed among the alumina particles and among the XX particles, resulting that the resultant substrate 19 is highly densified. In addition, the reaction of the glass with the alumina particles produces anorthite and celsian crystals.

Explained hereinbelow is another method for fabricating a green sheet with reference to FIG. 5. The alumina particles 50a are ground into powders so that the powders have the average diameter ranging from 0.5 to 3 micrometers. The XX powders 50b are similarly ground into powders having the average diameter in the range of 0.5 to 10 micrometers. Furthermore, borosilicate glass 50c is ground into powders, for instance, by an alumina ball mill so that the powders have the average diameter ranging from 1 to 5 micrometers. Similarly, anorthite and celsian 50d are ground into powders so that the powders have the average diameter ranging from 1 to 10 micrometers. These powders are weighed with a weighing device 51 so that they constitute a target composition rate, and then uniformly mixed with an alumina ball mill 52. Then, the mixed powder 53 including the powders 50a, 50b, 50c and 50d together with organic binder 54 such as polyvinyl butyral, polyvinyl alcohol and polyacrylic resin are dispersed in solvent 55. The solvent 55 including the mixed powder 53 and the binder 54 is stirred up for a sufficient period of time, thereby the mixture becomes slurry 56. Then, the slurry 56 is introduced into a green sheet forming apparatus 57 through an inlet 58 thereof. The apparatus 57 forms a green sheet by means of slip casting process such as doctor blade process and roll process, so that the green sheet has the thickness suitable for forming an insulation layer. For instance, a green sheet has a thickness in the range of 10 to 400 micrometers. The slurry 56 of the mixture is deposited on an endless forming belt 59 and then transported as the forming belt 59 runs. Above the forming belt 59 is disposed a heater 60 for applying heat to the slurry 56 being fed on the forming belt 59. The slurry 56 is thermally cured by heat applied from the heater 60 to thereby continuously form a green sheet 61. Thus fabricated green sheet 61 is wound up around a roller 62 disposed above an end of the forming belt 59.

Thus fabricated green sheet 61 is subject to the steps as illustrated in FIG. 2, thereby to obtain a multilayer glass ceramic substrate.

Tables 6 and 7 show the firing condition under which the multilayer glass ceramic substrate 19 was fabricated, and the specification and characteristics of leading wires. As aforementioned, the sample numbers in Tables 4 and 5 show the constituent of the glass ceramic layers in the fired substrate, and correspond to the sample numbers shown in Tables 6 and 7.

TABLE 6

| Sample No. | Firing Temp. [°C.] | Conductor | Atmosphere | Number of layers | Width [μm] | Pitch [μm] | Diameter [μm] | Dielectric Constant | Thermal Expansion Coefficient [×10⁻⁷/deg] | Anti-Bend Strength [Kg/cm²] | Insulation Resistance [Ω-cm] |
|---|---|---|---|---|---|---|---|---|---|---|---|
| 1 | 900 | Ag | Air | 30 | 120 | 300 | 150 | 5.2 | 40 | 2200 | $>10^{13}$ |
| 2 | 900 | Ag | Air | 30 | 120 | 300 | 150 | 5.1 | 41 | 2300 | $>10^{13}$ |
| 3 | 910 | Ag-Pd | Air | 30 | 120 | 300 | 150 | 5.0 | 43 | 2300 | $>10^{13}$ |
| 4 | 880 | Cu | $N_2$ | 30 | 120 | 250 | 120 | 5.3 | 40 | 2200 | $>10^{13}$ |
| 5 | 850 | Cu | $N_2$ | 30 | 120 | 250 | 120 | 5.3 | 43 | 2300 | $>10^{13}$ |
| 6 | 850 | Cu | $N_2$ | 30 | 120 | 250 | 120 | 4.9 | 46 | 2600 | $>10^{13}$ |
| 7 | 900 | Cu | $N_2 + H_2O$ | 40 | 150 | 300 | 150 | 5.6 | 40 | 2300 | $>10^{13}$ |
| 8 | 910 | Cu | $N_2 + H_2O$ | 40 | 150 | 300 | 150 | 5.4 | 44 | 2300 | $>10^{13}$ |
| 9 | 900 | Ag | Air | 40 | 150 | 300 | 150 | 5.1 | 48 | 2400 | $>10^{13}$ |
| 10 | 900 | Ag | Air | 40 | 150 | 300 | 150 | 4.8 | 49 | 2600 | $>10^{13}$ |
| 11 | 890 | Ag | Air | 40 | 150 | 300 | 200 | 5.6 | 43 | 2700 | $>10^{13}$ |
| 12 | 880 | Ag | Air | 40 | 150 | 300 | 200 | 5.4 | 47 | 2500 | $>10^{13}$ |
| 13 | 900 | Ag-Pd | Air | 40 | 150 | 300 | 200 | 5.3 | 49 | 2400 | $>10^{13}$ |
| 14 | 880 | Ag-Pd | Air | 30 | 150 | 300 | 200 | 5.0 | 52 | 2600 | $>10^{13}$ |
| 15 | 880 | Ag-Pd | Air | 30 | 100 | 200 | 100 | 6.3 | 41 | 2600 | $>10^{13}$ |
| 16 | 900 | Ag-Pd | Air | 30 | 100 | 200 | 100 | 6.0 | 45 | 2400 | $>10^{13}$ |
| 17 | 870 | Ag | Air | 30 | 100 | 250 | 120 | 6.0 | 46 | 2500 | $>10^{13}$ |
| 18 | 850 | Ag | Air | 30 | 100 | 250 | 120 | 5.8 | 49 | 2500 | $>10^{13}$ |
| 19 | 890 | Ag | Air | 30 | 100 | 250 | 120 | 6.0 | 47 | 2700 | $>10^{13}$ |
| 20 | 900 | Ag | Air | 35 | 100 | 300 | 150 | 5.9 | 47 | 2500 | $>10^{13}$ |
| 21 | 900 | Cu | $N_2 + H_2O$ | 40 | 100 | 200 | 90 | 5.6 | 50 | 2500 | $>10^{13}$ |
| 22 | 900 | Cu | $N_2 + H_2O$ | 40 | 100 | 200 | 90 | 5.7 | 46 | 2400 | $>10^{13}$ |
| 23 | 880 | Cu | $N_2 + H_2O$ | 40 | 100 | 200 | 90 | 5.7 | 46 | 2600 | $>10^{13}$ |
| 24 | 880 | Ag | Air | 40 | 100 | 200 | 90 | 5.6 | 50 | 2600 | $>10^{13}$ |
| 25 | 850 | Ag | Air | 40 | 100 | 200 | 90 | 6.0 | 43 | 2400 | $>10^{13}$ |
| 26 | 850 | Ag | Air | 40 | 100 | 200 | 90 | 6.1 | 48 | 2500 | $>10^{13}$ |
| 27 | 860 | Ag | Air | 40 | 100 | 200 | 90 | 6.1 | 41 | 2500 | $>10^{13}$ |
| 28 | 870 | Ag | Air | 40 | 100 | 200 | 90 | 5.8 | 45 | 2700 | $>10^{13}$ |
| 29 | 900 | Cu | $N_2 + H_2O$ | 40 | 100 | 200 | 90 | 5.7 | 48 | 2500 | $>10^{13}$ |
| 30 | 900 | Cu | $N_2 + H_2O$ | 40 | 100 | 200 | 90 | 5.6 | 46 | 2300 | $>10^{13}$ |

TABLE 7

| Sample No. | Firing Temp. [°C.] | Conductor | Atmosphere | Number of layers | Width [μm] | Pitch [μm] | Diameter [μm] | Dielectric Constant | Thermal Expansion Coefficient [×10⁻⁷/deg] | Anti-Bend Strength [Kg/cm²] | Insulation Resistance [Ω-cm] |
|---|---|---|---|---|---|---|---|---|---|---|---|
| 31 | 900 | Cu | $N_2$ | 35 | 100 | 300 | 150 | 5.9 | 43 | 2500 | $>10^{13}$ |
| 32 | 850 | Cu | $N_2$ | 35 | 100 | 300 | 150 | 5.6 | 48 | 2800 | $>10^{13}$ |
| 33 | 930 | Cu | $N_2$ | 35 | 100 | 300 | 150 | 6.6 | 39 | 2400 | $>10^{13}$ |
| 34 | 900 | Cu | $N_2$ | 40 | 150 | 300 | 150 | 5.9 | 45 | 2500 | $>10^{13}$ |
| 35 | 910 | Cu | $N_2 + H_2$ | 40 | 150 | 350 | 150 | 5.7 | 48 | 2500 | $>10^{13}$ |
| 36 | 900 | Au | Air | 40 | 150 | 350 | 150 | 5.6 | 50 | 2600 | $>10^{13}$ |
| 37 | 900 | Ag | Air | 40 | 150 | 250 | 150 | 5.6 | 51 | 2700 | $>10^{13}$ |
| 38 | 880 | Cu | $N_2$ | 40 | 150 | 250 | 150 | 6.0 | 53 | 2800 | $>10^{13}$ |
| 39 | 950 | Cu | $N_2$ | 40 | 120 | 300 | 150 | 6.5 | 45 | 2500 | $>10^{13}$ |
| 40 | 930 | Ag-Pd | Air | 30 | 120 | 300 | 120 | 6.4 | 47 | 2500 | $>10^{13}$ |
| 41 | 900 | Ag-Pd | Air | 30 | 120 | 300 | 120 | 6.2 | 49 | 2400 | $>10^{13}$ |
| 42 | 900 | Au | Air | 30 | 120 | 300 | 120 | 6.0 | 51 | 2300 | $>10^{13}$ |
| 43 | 930 | Cu | $N_2$ | 30 | 120 | 250 | 100 | 6.5 | 48 | 2400 | $>10^{13}$ |
| 44 | 910 | Cu | $N_2$ | 30 | 120 | 250 | 100 | 6.3 | 50 | 2400 | $>10^{13}$ |
| 45 | 950 | Ag-Pd | Air | 30 | 120 | 250 | 100 | 6.2 | 51 | 2300 | $>10^{13}$ |
| 46 | 950 | Ag-Pd | Air | 30 | 100 | 200 | 80 | 6.2 | 51 | 2300 | $>10^{13}$ |
| 47 | 930 | Ag-Pd | Air | 40 | 100 | 250 | 120 | 6.5 | 50 | 2400 | $>10^{13}$ |
| 48 | 960 | Ag-Pd | Air | 40 | 100 | 250 | 120 | 6.3 | 52 | 2300 | $>10^{13}$ |
| 49 | 900 | Ag | Air | 40 | 100 | 250 | 120 | 6.2 | 54 | 2200 | $>10^{13}$ |
| 50 | 900 | Cu | $N_2$ | 40 | 80 | 200 | 80 | 6.3 | 55 | 2100 | $>10^{13}$ |

As is clearly understood from Tables 6 and 7, the compounds in accordance with the aforementioned embodiment can provide a multilayer glass ceramic substrate on which highly densified and fine leading wires can be arranged and which is superior in many characteristics and has mechanical strength necessary for practical use.

Following points were clarified by the embodiment.

1. If the content of alumina is under 12 weight percent, the resistance against bend of the substrate is below 2000 kilograms per square centimeter. This is not sufficient strength for a substrate. If the content of alumina is above 59.6 weight percent, the substrate cannot be sufficiently fired at the temperature below 1000 degrees centigrade, resulting that the insulation resistance is decreased and the resistance against bend is below 2000 kilograms per square centimeter. In addition, since the dielectric constant of the substrate exceeds 7, high speed operation is difficult to achieve and accordingly it is difficult to obtain a multilayer glass ceramic substrate suitable for practical use.

2. If the content of XX is below 10 weight percent, the dielectric constant exceeds seven (7). Furthermore, if the content of XX is above 30 weight percent, the substrate cannot be sufficiently fired, the insulation resistance of the substrate is deteriorated, and the anti-bend resistance of the substrate is decreased less than 2000 kilograms per square centimeter.

3. If the content of borosilicate glass is under 18 weight percent, it is not possible to obtain glass phase for sufficiently filling gaps disposed among alumina particles and XX particles with the result that the strength and the reliability of the substrate is decreased. If the content of borosilicate glass is above 69.6 weight percent, the inherent strength of glass is predominant, resulting that the anti-bend strength is decreased below 2000 kilograms per square centimeter.

4. If the content of the anorthite and celsian crystals is below 1 weight percent, the substrate cannot have the strength against bend above 2000 kilograms per square centimeter for lack of assist of the anorthite crystals to the anti-bend strength. If the content of the anorthite crystals is over 40 weight percent and the content of the celsian crystals is over 5 weight percent, the flexibility of the multilayer glass ceramic substrate becomes uniform with result that the reliability is reduced.

5. If the content of alumina powder used as raw material is below 30 weight percent, the alumina powder is reacted with glass in low level, so that the crystals of the anorthite and celsian is insufficiently produced during the firing step, or the crystals of the anorthite and celsian is produced with lack of uniformity, both resulting that the anti-bend resistance of the substrate is below 2000 kilograms per square centimeter. If the content of alumina powder is above 60 weight percent, the substrate cannot be sufficiently fired at the temperature below 1000 degrees centigrade, resulting that the insulation resistance is decreased and the resistance against bend is also decreased. In addition, the dielectric constant of the substrate exceeds seven (7).

6. If the content of borosilicate glass powder used as raw material is below 40 weight percent, the alumina powder is reacted with the glass powder in lower level, so that the growth of the crystals of the anorthite and celsian is prevented to a large extend and accordingly the crystals grow unhomogeneously. This causes lower strength of the substrate. If the content of borosilicate glass powder is above 70 weight percent, the glass are more softened during the firing step. This causes the fired substrate to have dimensional instability, and hence it is not possible to obtain a substrate suitable for practical use.

7. If borosilicate glass used as raw material contains calcium in the form of calcium oxide below 5 weight percent when represented with oxide equivalent representation, the crystals of anorthite is scarcely produced. If the content of barium oxide is below 0.1 weight percent in a similar representation, the crystals of celsian is scarcely produced.

8. If the diameter of alumina powder used as raw material is below 0.5 micrometers or above 3 micrometers, the diameter of XX powder is below 0.5 micrometer or above 10 micrometers, the diameter of borosilicate glass powder is below 1 micrometer or above 5 micrometers, and the diameter of anorthite and celsian powders is below 1 micrometer or 10 micrometers, the mixture cannot be well fired, and hence the characteristics reliability of a multilayer glass ceramic substrate is enormously deteriorated. Thus, a multilayer glass ceramic substrate suitable for practical use cannot be obtained.

As aforementioned, the present invention provides a multilayer glass ceramic substrate which can be fired not only at the temperature not more than 1000 degrees centigrade but also in neutral and reducing atmosphere as well as oxidizing atmosphere and which has low dielectric constant and superior mechanical strength. Accordingly, the present invention can provide a substrate in which low resistive metals such as Au, Ag, Cu and Ag-Pd can be used as leading wires, and which enables highly densified arrangement of minute leading wires and high operation speed.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A multilayer glass ceramic substrate comprising:

a glass ceramic layer; and a plurality of conductive layers laminated on said glass ceramic layer, a plurality of via holes connecting upper and lower conductors and filled with conductive paste, said glass ceramic layer being composed of inorganic compound consisting of aluminum oxide, borosilicate glass, anorthite crystal and celsian crystal wherein said aluminum oxide is contained in the range of 12 to 59.6 weight percent, said borosilicate glass is contained in the range of 18 to 69.6 weight percent, said anorthite crystal is contained in the range of 1 to 40 weight percent and said celsian crystal is contained in the range of 1 to 5 weight percent so that the total is 100 weight percent, said anorthite and celsian crystals being produced during firing the substrate, and forming a highly densified three dimensional structure with aluminum oxide particles and vitreous parts.

2. A multilayer glass ceramic substrate in accordance with claim 1, wherein said multilayer glass ceramic substrate is fabricated from mixed powder including aluminum oxide powder in the range of 30 to 60 weight percent and borosilicate glass powder in the range of 40 to 70 weight percent so that the total is 100 weight percent.

3. A multilayer glass ceramic substrate in accordance with claim 2, wherein said borosilicate glass powder contains at least 5 weight percent of calcium oxide and at least 0.1 weight percent of barium oxide.

4. A multilayer glass ceramic substrate comprising:

a glass ceramic layer; and a plurality of conductive layers laminated on said glass ceramic layer, a plurality of via holes connecting upper and lower conductors and filled with conductive paste, said glass ceramic layer being composed of inorganic compound consisting of aluminum oxide, XX, borosilicate glass, anorthite crystal and celsian crystal wherein said aluminum oxide is contained in the range of 12 to 59.6 weight percent, said XX is contained in the range of 10 to 30 weight percent, said borosilicate glass is contained in the range of 18 to 69.6 weight percent, said anorthite crystal is contained in the range of 1 to 40 weight percent and said celsian crystal is contained in the range of 1 to 5 weight percent so that the total is 100 weight percent, said XX being selected one or more from the group consisting of mullire, silica glass, α-silica and cordierite, said anorthite and celsian crystals being produced during firing the substrate, and forming a highly densified three dimensional structure with aluminum oxide particles and vitreous parts.

5. A multilayer glass ceramic substrate in accordance with claim 4, wherein said multilayer glass ceramic substrate is made from mixed powder including aluminum oxide powder in the range of 10 to 50 weight percent, XX powder in the range of 10 to 50 weight percent and borosilicate glass powder in the range of 40 to 70 weight percent so that the total is 100 weight percent.

6. A multilayer glass ceramic substrate in accordance with claim 4, wherein said borosilicate glass powder contains at least 5 weight percent of calcium oxide and at least 0.1 weight percent of barium oxide.

7. A glass ceramic layer suitable for use of a multilayer glass ceramic substrate, comprising inorganic compound consisting of aluminum oxide ranging from 12 to 59.6 weight percent, borosilicate glass ranging from 18 to 69.6 weight percent, anorthite crystal ranging from 1 to 40 weight percent and celsian crystal ranging from 1 to 5 weight percent so that the total is 100 weight percent, said anorthite and celsian crystals being produced during firing the substrate, and forming a highly densified three dimensional structure with aluminum oxide particles and vitreous parts.

8. A glass ceramic layer suitable for use of a multilayer glass ceramic substrate, comprising inorganic compound consisting of aluminum oxide ranging from 12 to 59.6 weight percent, XX ranging from 10 to 30 weight percent, borosilicate glass ranging from 18 to 69.6 weight percent, anorthite crystal ranging from 1 to 40 weight percent and celsian crystal ranging from 1 to 5 weight percent so that the total is 100 weight percent, said XX being selected one or more from the group consisting of mullite, silica glass, α-silica and cordierite, said anorthite and celsian crystals being produced during firing the substrate, and forming a highly densified three dimensional structure with aluminum oxide particles and vitreous parts.

\* \* \* \* \*